(12) United States Patent
Choi et al.

(10) Patent No.: US 7,994,706 B2
(45) Date of Patent: Aug. 9, 2011

(54) ORGANIC LIGHT EMITTING DIODE DISPLAY DEVICE AND METHOD OF FABRICATING THE SAME

(75) Inventors: Jong-Hyun Choi, Suwon-si (KR); Kyung-Jin Yoo, Suwon-si (KR); Hee-Chul Jeon, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 535 days.

(21) Appl. No.: 12/152,601

(22) Filed: May 14, 2008

(65) Prior Publication Data

US 2008/0284326 A1    Nov. 20, 2008

(30) Foreign Application Priority Data

May 15, 2007    (KR) .................. 10-2007-0047135

(51) Int. Cl.
*H01L 51/00*    (2006.01)
(52) U.S. Cl. .................. 313/504; 313/506; 445/24
(58) Field of Classification Search .............. 445/24–25; 313/498–512
See application file for complete search history.

(56) References Cited

U.S. PATENT DOCUMENTS

| | | | |
|---|---|---|---|
| 6,162,667 A | | 12/2000 | Funai et al. |
| 2004/0007970 A1* | | 1/2004 | Ma et al. ................. 313/504 |
| 2005/0140277 A1* | | 6/2005 | Suzuki et al. ............ 313/504 |
| 2006/0066229 A1* | | 3/2006 | Nimura ................... 313/506 |
| 2006/0214567 A1* | | 9/2006 | Luo et al. ................ 313/504 |

FOREIGN PATENT DOCUMENTS

| | | |
|---|---|---|
| JP | 7-58334 | 3/1995 |
| JP | 8-116061 | 5/1996 |
| JP | 2002-299630 | 10/2002 |
| JP | 2004-214606 | 7/2004 |
| JP | 2004-260194 | 9/2004 |
| JP | 2005-292768 | 10/2005 |
| KR | 2000-0062816 | 10/2000 |
| KR | 10-2003-0073569 | 9/2003 |
| KR | 10-2004-0000630 | 1/2004 |
| KR | 10-2005-0002563 | 1/2005 |
| KR | 10-2005-0003518 | 1/2005 |
| KR | 10-2005-0110729 | 11/2005 |

OTHER PUBLICATIONS

Patent Abstracts of Japan, Publication No. 08-116061, Published on May 7, 1996, in the name of Ino, et al.
Patent Abstracts of Japan, Publication No. 2002-299630, Published on Oct. 11, 2002, in the name of Inoue.

(Continued)

*Primary Examiner* — Anne M Hines
(74) *Attorney, Agent, or Firm* — Christie, Parker & Hale, LLP

(57) ABSTRACT

Provided is an organic light emitting diode (OLED) display device, including: a substrate; a semiconductor layer on the substrate; a gate insulating layer on the substrate with the semiconductor layer; a gate electrode on a region of the gate insulating layer corresponding to the semiconductor layer and insulated from the semiconductor layer; source and drain electrodes connected to the semiconductor layer; metal layers on the source and drain electrodes, spaced a distance apart from each other, and including nickel; a passivation layer over the gate insulating layer; a first electrode on the passivation layer, and electrically connected to the metal layers; an organic layer on the first electrode; and a second electrode on the organic layer.

20 Claims, 3 Drawing Sheets

OTHER PUBLICATIONS

Patent Abstracts of Japan, Publication No. 2004-214606, Published on Jul. 29, 2004, in the name of Goto, et al.
Patent Abstracts of Japan, Publication No. 2004-260194, Published on Sep. 16, 2004, in the name of Ishigami, et al.
Patent Abstracts of Japan, Publication No. 2005-292768, Published on Oct. 20, 2005, in the name of Matsubara, et al.
Korean Patent Abstracts, Publication No. 1020000062816 A, Published on Oct. 25, 2000, in the name of Shimada.
Korean Patent Abstracts, Publication No. 1020030073569 A, Published on Sep. 19, 2003, in the name of Lim, et al.
Korean Patent Abstracts, Publication No. 1020040000630 A, Published on Jan. 7, 2004, in the name of Choi, et al.
Korean Patent Abstracts, Publication No. 1020050002563 A, Published on Jan. 7, 2005, in the name of Cho, et al.

* cited by examiner

ORGANIC LIGHT EMITTING DIODE DISPLAY DEVICE AND METHOD OF FABRICATING THE SAME

CROSS-REFERENCE TO RELATED APPLICATION

This application claims priority to and the benefit of Korean Patent Application No. 10-2007-0047135, filed May 15, 2007, the entire content of which is incorporated herein by reference.

BACKGROUND OF THE INVENTION

1. Field of the Invention

The present invention relates to an organic light emitting diode (OLED) display device and a method of fabricating the same, and more particularly, to an OLED display device including a metal layer containing nickel to reduce contact resistance.

2. Description of the Related Art

Flat panel display devices, such as organic light emitting diode display devices or liquid crystal display devices, have N×M unit pixels disposed in a matrix, and they may be classified into passive matrix types or active matrix types, depending on their driving methods. In the active matrix type, a pixel electrode, defining an emission region, and a unit pixel drive circuit, for applying a current or voltage to the pixel electrode, are formed in a unit pixel region. The unit pixel drive circuit includes at least one thin film transistor.

A thin film transistor generally includes a semiconductor layer, a gate electrode, and source and drain electrodes. Here, source and drain regions are at edge portions of the semiconductor layer, and a channel region is between the source and drain regions. Also, the thin film transistor is used as a switching device for controlling the operation of an unit pixel and a driving device for driving the pixel.

However, a conventional OLED display device, including a thin film transistor, has reduced charge mobility because of high contact resistance between the source and drain electrodes, which are formed of aluminum, and a first electrode that is a transparent conductive layer. Due to the reduction in charge mobility, signal delay may occur, thereby causing deterioration in display quality of the OLED display device. Also, since the source and drain electrodes formed of aluminum are easily oxidized in the atmosphere, an oxide layer may be formed between the source and drain electrodes and the first electrode, resulting in an increase in contact resistance therebetween. Also, a top-emission OLED display device uses a first electrode, including a reflective layer, which has high contact resistance between the reflective layer and the transparent conductive layer of the first electrode. Thus, charges are not easily transported to an organic layer, and luminous efficiency of the OLED display device is lowered.

SUMMARY OF THE INVENTION

An aspect of an embodiment of the present invention is directed toward an organic light emitting diode (OLED) display device, which may reduce contact resistances between a first electrode and source and drain electrodes, and between a reflective layer and a transparent conductive layer of the first electrode, and a method of fabricating the same.

An embodiment of the present invention provides an organic light emitting diode (OLED) display device, including: a substrate; a semiconductor layer on the substrate; a gate insulating layer on the substrate with the semiconductor layer; a gate electrode on a region of the gate insulating layer corresponding to the semiconductor layer and insulated from the semiconductor layer; source and drain electrodes connected to the semiconductor layer; metal layers on the source and drain electrodes, and spaced a distance apart from each other, and the metal layers including nickel; a passivation layer on the substrate with the gate insulating layer; a first electrode on the passivation layer, and electrically connected to the metal layers; an organic layer on the first electrode; and a second electrode on the organic layer.

Another embodiment of the present invention provides an organic light emitting diode (OLED) display device, including: a substrate; a semiconductor layer on the substrate; a gate insulating layer on the substrate with the semiconductor layer; a gate electrode on the gate insulating layer corresponding to the semiconductor layer; an interlayer insulating layer on the gate insulating layer; source and drain electrodes extending through the interlayer insulating layer and connected to the semiconductor layer; a passivation layer on the interlayer insulating layer and the source and drain electrodes; a first electrode on the passivation layer, the first electrode including: a reflective layer coupled to the source and drain electrodes; metal layers on the reflective layer, and spaced a distance apart from each other, and the metal layers including nickel; and a transparent conductive layer on the metal layers; an organic layer on the first electrode; and a second electrode on the organic layer.

Another embodiment of the present invention provides a method of fabricating an organic light emitting diode (OLED) display device, the method includes: preparing a substrate; forming a semiconductor layer on the substrate; forming a gate insulating layer on the substrate with the semiconductor layer; forming a gate electrode in a region corresponding to the semiconductor layer on the gate insulating layer; forming an interlayer insulating layer on the gate insulating layer and the gate electrode; forming source and drain electrodes connected to the semiconductor layer through a contact hole in the interlayer insulating layer; forming a metal material layer on the source and drain electrodes; forming a passivation layer on the interlayer insulating layer and the metal layer; forming a first electrode electrically connected to the metal layer, and on the passivation layer; forming an organic layer on the first electrode; and forming a second electrode on the organic layer.

Another embodiment of the present invention provides a method of fabricating an organic light emitting diode (OLED) display device, the method includes: preparing a substrate; forming a semiconductor layer on the substrate; forming a gate insulating layer on the semiconductor layer; forming a gate electrode in a region corresponding to the semiconductor layer on the gate insulating layer; forming an interlayer insulating layer on the gate insulating layer and the gate electrode; forming source and drain electrodes connected to the semiconductor layer through a contact hole in the interlayer insulating layer; forming a passivation layer on the source and drain electrodes, and the gate insulating layer; forming a via hole in the passivation layer to partially expose the source and drain electrodes; forming a metal material layer over the source and drain electrodes; forming a first electrode electrically connected to the metal layer, and on the passivation layer; forming an organic layer on the first electrode; and forming a second electrode on the organic layer.

Another embodiment of the present invention provides a method of fabricating an organic light emitting diode (OLED) display device, the method including: preparing a substrate; forming a semiconductor layer on the substrate; forming a gate insulating layer on the semiconductor layer; forming a gate electrode in a region corresponding to the semiconductor layer on the gate insulating layer; forming an interlayer insulating layer on the gate insulating layer with the gate electrode; forming source and drain electrodes connected to the semiconductor layer through a contact hole in the interlayer insulating layer; forming a passivation layer over the interlayer insulating layer and the source and drain electrodes; forming a first electrode by sequentially stacking a reflective layer connected to the source and drain electrodes on the passivation layer, metal layers on the reflective layer, and spaced a distance apart from each other and the metal layers including nickel, and a transparent conductive layer on the metal layers; forming an organic layer on the first electrode; and forming a second electrode on the organic layer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF THE INVENTION

Figure 1A:
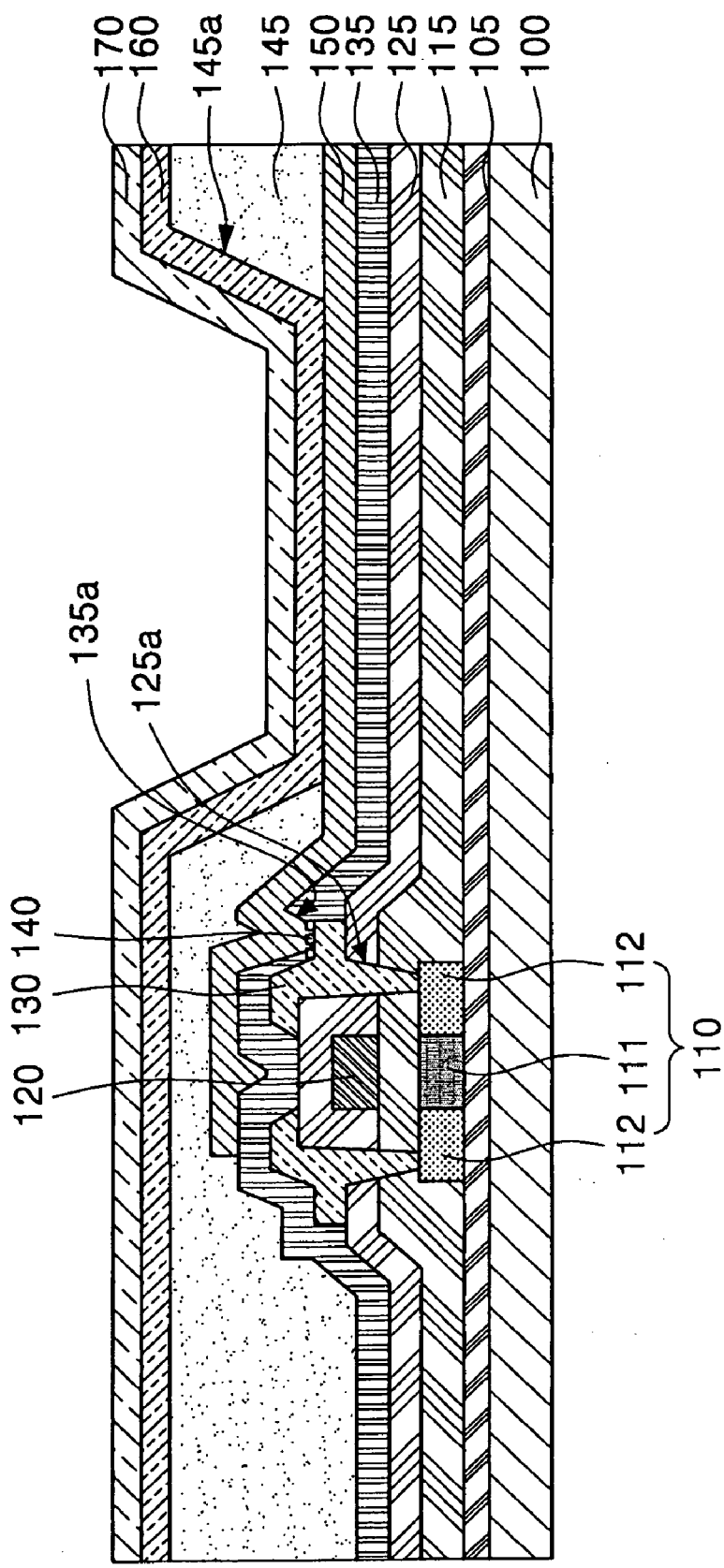
FIG. 1A is a cross-sectional view of an organic light emitting diode (OLED) display device according to a first exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification. Also, in the context of the present application, when an element is referred to as being "on" another element, it can be directly on the another element or be indirectly on the another element with one or more intervening elements interposed therebetween.

FIG. 1A is a cross-sectional view of an organic light emitting diode (OLED) display device according to a first exemplary embodiment of the present invention.

Referring to FIG. 1A, a buffer layer 105 is on a substrate 100 formed of glass, stainless steel and/or plastic. The buffer layer 105 may be a silicon nitride layer, a silicon oxide layer, or multiple layers thereof. Here, the buffer layer 105 serves to facilitate crystallization of a semiconductor layer 110 by preventing (or reducing) diffusion of moisture or impurities in the substrate 100, or controlling heat transfer during crystallization.

An amorphous silicon layer is crystallized on the buffer layer 105, thereby forming a polycrystalline or single crystalline silicon layer. The amorphous silicon layer may be formed by chemical vapor deposition (CVD) and/or physical vapor deposition (PVD). Also, the amorphous silicon layer may be dehydrogenated to lower a hydrogen concentration. Further, the amorphous silicon layer may be crystallized using rapid thermal annealing (RTA), solid phase crystallization (SPC), metal induced crystallization (MIC), metal induced lateral crystallization (MILC), super grain silicon (SGS), excimer laser crystallization (ELA), and/or sequential lateral solidification (SLS).

A semiconductor layer 110 is formed by patterning the polycrystalline or single crystalline silicon layer. A gate insulating layer 115, which may be a silicon oxide layer, a silicon nitride layer or a multiple layer thereof, is formed on (or over) the entire surface of the substrate 100 with the semiconductor layer 110, and a gate electrode 120 is formed in a region corresponding to the semiconductor layer 110 on the gate insulating layer 115. The gate electrode 120 may include aluminum (Al), an aluminum alloy (Al alloy), molybdenum (Mo), and/or a molybdenum alloy (Mo alloy). In one embodiment, the gate electrode 120 includes a molybdenum-tungsten (MoW) alloy.

A mask is disposed on the gate electrode 120, and the semiconductor layer 110 is doped with impurity ions, thereby forming source and drain regions 112 and a channel region 111.

The mask is removed after the semiconductor layer 110 has been doped, and an interlayer insulating layer 125 is disposed on (or over) the entire surface of the substrate 100 with the gate electrode 120. The interlayer insulating layer 125 may be silicon nitride layer and/or a silicon oxide.

Contact holes 125a are formed by etching the interlayer insulating layer 125; and source and drain electrodes 130, connected to the source and drain regions 112 through the contact hole 125a, are formed to a thickness ranging from about 3000 to about 4000 Å (or 3000 to 4000 Å) by sputtering. The source and drain electrodes 130 may be formed of Al.

A metal material layer containing nickel is disposed on (or over) the entire surface of the substrate 100 with the source and drain electrodes 130 by sputtering, and then patterned so that the metal material layer remains only in a region for a via hole. The metal material layer may be formed to a thickness ranging from about 0.1 to about 0.5 mm (or 0.1 to 0.5 mm). When the metal material layer has a thickness within the above-mentioned range, contact resistance between a first electrode to be formed in the subsequent process and the source and drain electrodes 130 may be considerably reduced, and the thickness of the device is not greatly affected by an additional metal layer.

A passivation layer 135 is formed on the entire surface of the substrate 100 with the metal material layer, and a via hole 135a for exposing the metal material layer is formed through the passivation layer 135.

A first electrode 150, connected to the metal material layer through the via hole 135a, is formed of ITO, IZO, or ITZO, which have relatively high work functions.

The substrate 100, with the first electrode 150, is annealed for a time period ranging from about 0.5 to about 4 hours (or 0.5 to 4 hours) at a temperature ranging from about 150 to about 400° C. (or 150 to 400° C.). The metal material layer, interposed between the source and drain electrodes 130 and the first electrode 150, moves toward (or concentrates at) the nickel, which has the lowest energy, to be lumped together by heating (i.e., an annealing occurs, due to the characteristics of nickel, which is a material forming the metal material layer). Accordingly, metal layers (or separate metal layers) 140 are interposed between the source and drain electrodes 130 and the first electrode 150. The metal layers 140 are spaced a distance apart from each other and contain nickel. The distance between the metal layers 140 is affected by annealing temperature and time, and may be in a range from about 0.01 to about 3 μm (or 0.01 to 3 μm).

A pixel defining layer 145 is formed on the first electrode 150, and patterned to form an opening 145a. The pixel defining layer 145 may be an organic layer such as polyimide, benzocyclobutene series resin, and/or acrylate, and/or an inorganic layer such as silicate on glass.

An organic layer 160, including an organic emitting layer, is formed on the first electrode 150 (and the pixel defining layer 145). The organic layer 160 may be formed by deposition, ink-jet printing, or laser induced thermal imaging. Also, the organic layer 160 may further include a hole injection layer, a hole transport layer, a hole blocking layer, an electron transport layer, and/or an electron injection layer.

A second electrode 170 is formed on the organic layer 160. The second electrode 170 may be formed of Ag, Al, Ca, Mg, or alloys thereof.

The OLED display device is sealed with an encapsulating substrate using a sealant and/or a frit.

Figure 1B:
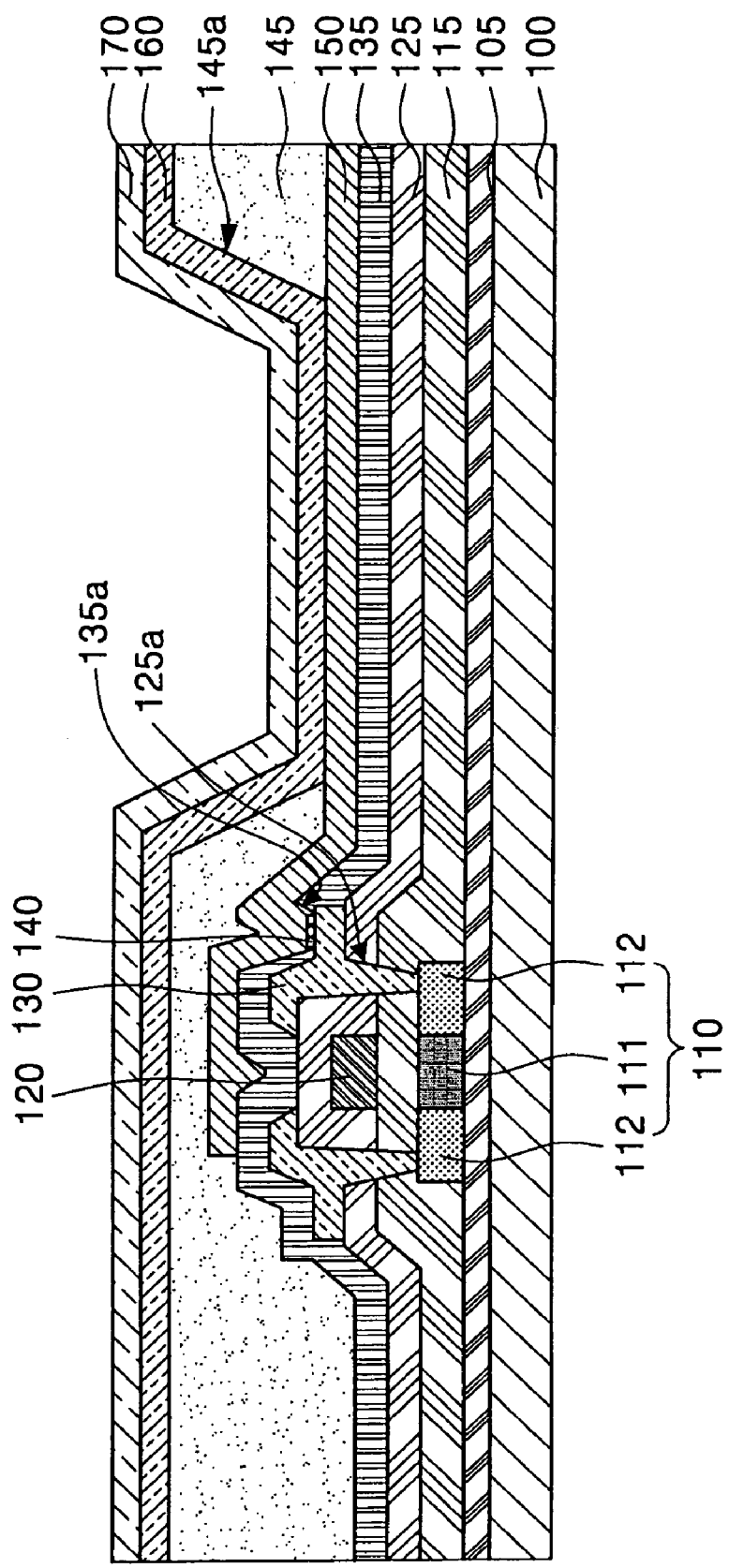
FIG. 1B is a cross-sectional view of an OLED display device according to a second exemplary embodiment of the present invention.

FIG. 1B is a cross-sectional view of an OLED display device according to a second exemplary embodiment of the present invention.

In the second exemplary embodiment of the present invention, the process is the same (or substantially the same) as that in the first embodiment of the present invention except for the formation of the source and drain electrodes, and thus a description thereof is not repeated.

Referring to FIG. 1B, a passivation layer 135 is formed on (or over) the entire surface of the substrate 100 with the source and drain electrodes 130; and a via hole 135a, partially exposing source and drain electrodes 130, is formed in the passivation layer 135.

Then, a metal material layer containing nickel is formed over the exposed part of the source and drain electrodes 130 by sputtering using a mask. Here, the metal material layer may be formed to a thickness ranging from about 0.1 to about 0.5 nm (or 0.1 to 0.5 nm). When the metal material layer has a thickness within the above-mentioned range, contact resistance between a first electrode, to be formed in the subsequent process, and the source and drain electrodes 130 may be considerably reduced, and the thickness of the device may not be affected by an additional metal layer. As a result, the passivation layer cannot be formed (or will not form) on the metal material layer.

A first electrode 150, connected to the metal material layer through the via hole 135a, is formed on the passivation layer 135. The first electrode 150 may be formed of ITO, IZO or ITZO, which have high work functions.

The substrate 100, with the first electrode 150, is annealed for a time ranging from about 0.5 to about 4 hours (or 0.5 to 4 hours) at a temperature ranging from about 150 to about 400° C. (or 150 to 400° C.). The metal material layer interposed between the source and drain electrodes 130 and the first electrode 150 moves toward (or concentrates at) the nickel, which has the lowest energy, to be lumped together by heating (i.e., an annealing occurs, due to the characteristics of nickel, which is a material forming the metal material layer). Accordingly, metal layers 140 (or separate metal layers) are interposed between the source and drain electrodes 130 and the first electrode 150. The metal layers 140 are spaced a distance apart from each other and contain nickel. The distance between the metal layers 140 is affected by the annealing temperature and time, and may be in a range from about 0.01 to about 3 µm (0.01 to 3 µm).

After that, a pixel defining layer 145, an organic layer 160, and a second electrode 170 are formed by the same (or substantially the same) method as described in the first exemplary embodiment.

The OLED display device is sealed with an encapsulating substrate using a sealant and/or a frit.

Figure 2:
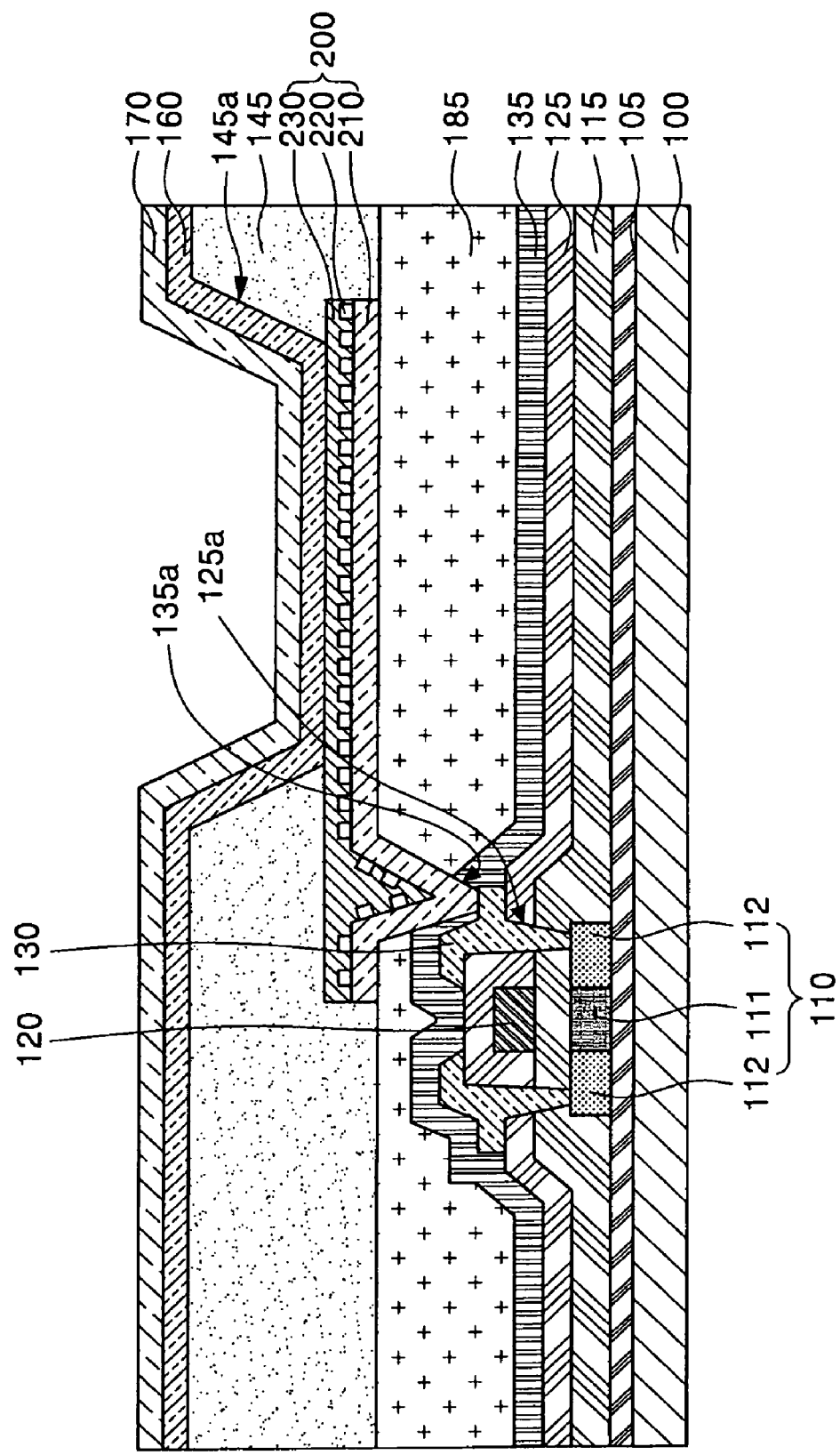
FIG. 2 is a cross-sectional view of an OLED display device according to a third exemplary embodiment of the present invention.

FIG. 2 is a cross-sectional view of an OLED display device according to a third exemplary embodiment of the present invention. In the third exemplary embodiment of the present invention, the process is the same (or substantially the same) as that in the first embodiment of the present invention until the formation of the source and drain electrodes, and thus a description thereof is not repeated.

Referring to FIG. 2, a passivation layer 135 is formed on (or over) the entire surface of a substrate 100, with source and drain electrodes 130, and a planarization layer 185 is formed on (or over) the entire surface of the substrate 100, with the passivation layer 135. The planarization layer 185 may be an organic layer, such as polyimide, benzocyclobutene series resin, and/or acrylate, and/or an inorganic layer, such as silicate on glass.

The passivation layer 135 and the planarization layer 185 are etched, thereby forming a via hole 135a for exposing the source and drain electrodes 130. A reflective material layer is disposed on the planarization layer 185 and connected to the source and drain electrodes 130 through the via hole 135a, and a metal material layer is formed on the reflective material layer. A transparent conductive material layer is disposed on the metal material layer. The reflective material layer, the metal material layer, and the transparent conductive material layer are blanket-etched to form a first electrode 200, which includes a stacked structure of a reflective layer 210, the metal material layer, and a transparent conductive layer 230.

The reflective layer 210 may be formed of aluminum or an aluminum alloy having high reflectance. Also, the metal material layer may be formed to a thickness ranging from about 0.1 to about 0.5 nm (or 0.1 nm to 0.5 nm). When the metal material layer has a thickness within the above-mentioned range, contact resistance between the transparent conductive layer 230 and the reflective layer 210 may be considerably reduced, and the thickness of the device is not greatly affected by an additional metal layer. The transparent conductive layer 230 may be formed of ITO, IZO, or ITZO, which have high work functions.

The substrate 100 with the transparent conductive layer 230 is annealed for a time period ranging from about 0.5 to about 4 hours (or 0.5 to 4 hours) at a temperature ranging from about 150 to about 400° C. (or 150 to 400° C.). The metal material layer moves toward (or concentrates at) the nickel, which has the lowest energy, to be lumped together by heating (i.e., an annealing occurs, due to the characteristics of nickel, which is a material forming the metal material layer). The metal layers 220 (or separate metal layers) are spaced a distance apart from each other between gaps formed by surface roughness of the reflective layer 210 and the transparent conductive layer 230. The interval between the metal layers 220 is affected by the annealing temperature and time, and may be in a range from about 0.01 to about 3 µm (or 0.01 to 3 µm).

As such, the first electrode 200 is formed by stacking the reflective layer 210, the metal layer 220 and the transparent conductive layer 230.

A pixel defining layer 145 is formed on the entire surface having the first electrode 200, and an opening 145a for partially exposing the first electrode 200 is formed.

An organic layer 160 having an emitting layer is formed on the first electrode 200 and the pixel defining layer 145, and a second electrode 170 is formed on the organic layer 160. The second electrode 170 is a semi-transparent electrode, and may be formed of magnesium silver (MgAg) and/or aluminum silver (AlAg). In one embodiment, MgAg is formed by co-depositing Mg and Ag. In another embodiment, AlAg is formed in a stacked structure by sequentially depositing Al and Ag. Also, a transparent conductive layer of ITO and/or IZO may be further formed on the second electrode 170.

In view of the foregoing and according to an embodiment of the invention, a metal layer containing nickel is formed between a first electrode and source and drain electrodes, thereby lowering contact resistance between the first electrode and source and drain electrodes, and improving charge mobility. Accordingly, signal delay of a thin film transistor may be prevented (or reduced), thereby improving display quality and reliability of a device. Also, in a top-emission OLED display device according to an embodiment of the invention, a metal layer containing nickel is interposed between a reflective layer and a transparent conductive layer of a first electrode, thereby lowering contact resistance and improving charge mobility of the first electrode, and thus luminous efficiency of the OLED display device can be improved.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting diode (OLED) display device, comprising:
    a substrate;
    a semiconductor layer on the substrate;
    a gate insulating layer on the substrate with the semiconductor layer;
    a gate electrode on a region of the gate insulating layer corresponding to the semiconductor layer and insulated from the semiconductor layer;
    source and drain electrodes connected to the semiconductor layer;
    metal layers on and contacting one of the source and drain electrodes, the metal layers being spaced from each other and comprising nickel;
    a passivation layer on the substrate with the gate insulating layer;
    a first electrode on the passivation layer, and electrically connected to the metal layers;
    an organic layer on the first electrode; and
    a second electrode on the organic layer.

2. The OLED display device according to claim 1, wherein the source and drain electrodes have a thickness between about 3000 Å and about 4000 Å.

3. The OLED display device according to claim 1, wherein the source and drain electrodes comprise aluminum.

4. The OLED display device according to claim 1, wherein the metal layers have a thickness between about 0.1 nm and about 0.5 nm.

5. The OLED display device according to claim 1, wherein the distance between the metal layers is between about 0.01 μm and about 3 μm.

6. The OLED display device according to claim 1, wherein the passivation layer comprises a via hole, and the metal layers are in the via hole.

7. An organic light emitting diode (OLED) display device, comprising:
    a substrate;
    a semiconductor layer on the substrate;
    a gate insulating layer on the substrate with the semiconductor layer;
    a gate electrode on the gate insulating layer corresponding to the semiconductor layer;
    an interlayer insulating layer on the gate insulating layer;
    source and drain electrodes extending through the interlayer insulating layer and connected to the semiconductor layer;
    a passivation layer on the interlayer insulating layer and the source and drain electrodes;
    a first electrode on the passivation layer, the first electrode comprising: a reflective layer coupled to one of the source and drain electrodes; metal layers on and contacting the reflective layer, the metal layers being spaced from each other, and comprising nickel; and a transparent conductive layer on the metal layers;
    an organic layer on the first electrode; and
    a second electrode on the organic layer.

8. The OLED display device according to claim 7, wherein the metal layers have a thickness between about 0.1 nm and about 0.5 nm.

9. The OLED display device according to claim 7, wherein the distance between the metal layers is between about 0.01 μm and about 3 μm.

10. The OLED display device according to claim 7, wherein the source and drain electrodes comprise aluminum.

11. A method of fabricating an organic light emitting diode (OLED) display device, the method comprising:
    forming a semiconductor layer on a substrate;
    forming a gate insulating layer on the substrate with the semiconductor layer;
    forming a gate electrode in a region corresponding to the semiconductor layer on the gate insulating layer;
    forming an interlayer insulating layer on the gate insulating layer and the gate electrode;
    forming source and drain electrodes connected to the semiconductor layer through a contact hole in the interlayer insulating layer;
    forming a plurality of metal material layers on and contacting one of the source and drain electrodes, the metal material layers being spaced from each other;
    forming a passivation layer on the interlayer insulating layer and the metal material layers;
    forming a first electrode electrically connected to the metal material layers, and on the passivation layer;
    forming an organic layer on the first electrode; and
    forming a second electrode on the organic layer.

12. The method according to claim 11, wherein the metal material layers are formed by sputtering.

13. The method according to claim 11, wherein the metal material layers are formed in a via hole of the passivation layer by patterning.

14. The method according to claim 11, wherein the substrate with the first electrode is annealed at a temperature between about 150° C. and about 400° C. after the first electrode has been formed.

15. A method of fabricating an organic light emitting diode (OLED) display device, the method comprising:
    forming a semiconductor layer on a substrate;
    forming a gate insulating layer on the semiconductor layer;
    forming a gate electrode in a region corresponding to the semiconductor layer on the gate insulating layer;
    forming an interlayer insulating layer on the gate insulating layer and the gate electrode;
    forming source and drain electrodes connected to the semiconductor layer through a contact hole in the interlayer insulating layer;
    forming a passivation layer on the source and drain electrodes, and the gate insulating layer;
    forming a via hole in the passivation layer to partially expose the source and drain electrodes;

forming a plurality of metal material layers on and contacting one of the source and drain electrodes, the metal material layers being spaced from each other;

forming a first electrode electrically connected to the metal material layers, and on the passivation layer;

forming an organic layer on the first electrode; and forming a second electrode on the organic layer.

16. The method according to claim 15, wherein the metal material layers are formed by sputtering.

17. The method according to claim 15, wherein the substrate with the first electrode is annealed at a temperature between about 150° C. and about 400° C. after the first electrode has been formed.

18. A method of fabricating an organic light emitting diode (OLED) display device, the method comprising:

forming a semiconductor layer on a substrate;

forming a gate insulating layer on the semiconductor layer;

forming a gate electrode in a region corresponding to the semiconductor layer on the gate insulating layer;

forming an interlayer insulating layer on the gate insulating layer with the gate electrode;

forming source and drain electrodes connected to the semiconductor layer through a contact hole in the interlayer insulating layer;

forming a passivation layer over the interlayer insulating layer and the source and drain electrodes;

forming a first electrode by sequentially stacking a reflective layer connected to one of the source and drain electrodes on the passivation layer, metal layers on and contacting the reflective layer, the metal layers being spaced from each other and comprising nickel, and a transparent conductive layer on the metal layers;

forming an organic layer on the first electrode; and forming a second electrode on the organic layer.

19. The method according to claim 18, wherein the metal layers are formed by sputtering.

20. The method according to claim 18, wherein the substrate with the first electrode is annealed at a temperature between about 150° C. and about 400° C. after the first electrode has been formed.

* * * * *